(12) United States Patent
Farrier

(10) Patent No.: US 7,518,645 B2
(45) Date of Patent: Apr. 14, 2009

(54) CMOS ACTIVE PIXEL SENSOR WITH IMPROVED DYNAMIC RANGE AND METHOD OF OPERATION

(75) Inventor: Michael Farrier, Boyne City, MI (US)

(73) Assignee: Goodrich Corp., Charlotte, NC (US)

( * ) Notice: Subject to any disclaimer, the term of this patent is extended or adjusted under 35 U.S.C. 154(b) by 656 days.

(21) Appl. No.: 11/030,843

(22) Filed: Jan. 6, 2005

(65) Prior Publication Data

US 2006/0146159 A1    Jul. 6, 2006

(51) Int. Cl.
  H04N 3/14    (2006.01)
  H04N 5/335   (2006.01)
  H01L 27/00   (2006.01)
(52) U.S. Cl. ............ 348/300; 348/301; 250/208.1
(58) Field of Classification Search ......... 348/300–310; 257/294
  See application file for complete search history.

(56) References Cited

U.S. PATENT DOCUMENTS

| 6,011,251 | A | 1/2000 | Dierickx et al. | 250/208.1 |
|---|---|---|---|---|
| 6,252,218 | B1* | 6/2001 | Chou | 250/208.1 |
| 6,486,504 | B1 | 11/2002 | Guidash | 257/222 |
| 6,710,804 | B1 | 3/2004 | Guidash | 348/302 |
| 6,734,905 | B2 | 5/2004 | Fossum et al. | 348/300 |
| 6,757,018 | B1 | 6/2004 | Fowler | 348/301 |
| 6,791,378 | B2* | 9/2004 | Rossi | 327/124 |
| 6,809,768 | B1* | 10/2004 | Merrill | 348/308 |
| 7,091,531 | B2* | 8/2006 | Boemler | 257/222 |
| 7,289,145 | B2* | 10/2007 | Johnson et al. | 348/229.1 |
| 2004/0251394 | A1 | 12/2004 | Rhodes et al. | 250/208.1 |
| 2005/0001143 | A1 | 1/2005 | Rhodes | 250/208.1 |
| 2005/0224843 | A1* | 10/2005 | Boemler | 257/233 |
| 2006/0243887 | A1* | 11/2006 | Boemler | 250/208.1 |

OTHER PUBLICATIONS

Yadid-Pecht et al., "*Wide Intrascene Dynamic Range CMOS APS Using Dual Sampling*", IEEE Transactions on Electron Devices, vol. 44, No. 10 (Oct. 1997).

(Continued)

*Primary Examiner*—David L Ometz
*Assistant Examiner*—Kelly L Jerabek
(74) *Attorney, Agent, or Firm*—McDonnell Boehnen Hulbert & Berghoff LLP

(57) ABSTRACT

A CMOS imaging array includes a plurality of individual pixels arranged in rows and columns. Each pixel is constructed the same and includes a photodetector (e.g., photodiode) receiving incident light and generating an output. A first, relatively lower gain, wide dynamic range amplifier circuit is provided responsive to the output of the photodetector. The first circuit is optimized for a linear response to high light level input signals. A second, relatively higher gain, lower dynamic range amplifier circuit is also provided which is responsive to the output of the photodetector. The second circuit is optimized to provide a high signal to noise ratio for low light level input signals. A first output select circuit is provided for directing the output of the first circuit to a first output multiplexer. A second output select circuit is provided for directing the output of the second circuit to a second output multiplexer. Thus, separate outputs of the first and second circuits are provided for each of the individual pixel sensors of the CMOS imaging array. Alternative embodiments incorporate two ore more photodetectors and two or more amplifier circuits and output select circuits. Three photodetectors and three amplifier circuits are useful for an embodiment where the sensor includes a three-color filter matrix.

22 Claims, 8 Drawing Sheets

OTHER PUBLICATIONS

Farrier et al., "*A Large Area TDI Image Sensor for Low Light Level Imaging*", IEEE Transactions on Electron Devices, vol. ED-27, No. 8 (Aug. 1980).

Search Report and Written Opinion in PCT/US05/46646, mailed Sep. 12, 2008.

International Preliminary Report on Paentability in PCT/US2005/46646, mailed Oct. 23, 2008.

* cited by examiner

CMOS ACTIVE PIXEL SENSOR WITH IMPROVED DYNAMIC RANGE AND METHOD OF OPERATION

BACKGROUND OF THE INVENTION

A. Field of the Invention

The present invention relates to solid state electronic image sensors and in particular to a Complementary Metal Oxide Semiconductor (CMOS) array with a pixel design which improves the operational dynamic range of the sensor. It is particularly suitable for application to airborne imaging systems, such as military aerial reconnaissance image sensors.

B. Description of Related Art

Image sensors for capturing electronic representations of images in the visible wavelengths have been around since about 1970, when the silicon charge coupled device (CCD) was invented. Over the years, CCDs have become the standard for visible spectrum electronic imaging, replacing film in most applications. Various architectures have been developed to make CCD operation more effective for the specific application. Such architectures include the full frame, frame transfer, and interline transfer CCD.

The processes related to silicon CCD manufacturing have always been reasonably expensive and complex, with the implementation technology of choice being N type metal oxide (NMOS). The associated costs and operational characteristics of NMOS CCDs, and later P type (PMOS) CCDs, eventually persuaded designers to seek an image sensor solution using the more easily manufactured CMOS technology. CMOS had become the technology of choice utilized by most foundries for making computer integrated circuits.

The advantages of using CMOS for image sensors included having a wider selection of foundries, lower manufacturing costs, lower power /voltage operation, and especially the ability to add peripheral CMOS circuitry on the image sensor substrate, the later feature being attractive for developing an image sensor on a single chip. CMOS imagers therefore could have active circuitry added within the picture sensing element structure (pixel). These imagers became known as Active Pixel Sensors (APS). The APS CMOS image sensor (CIS) became feasible approximately ten years ago when CMOS processing technology advanced to the point of enabling minimum feature sizes small enough to meet the required pixel circuit density, while maintaining adequate optical aperture for a small pixel (diffraction limited) visible image sensor.

As CMOS image sensor technology continues to progress, the comparison of performance between the CCD and the CMOS image sensor has become an important topic of discussion by designers and end users. Today, CMOS imager development has yielded a sensor with characteristics close to that of the CCD, but still lacking in some respects. Overall, the CMOS APS has the advantage of lower cost and design flexibility, but has yet to fully match the performance of the CCD.

Currently, foundry-based CMOS image sensor technologies largely focus on manufacturing of low cost visible sensors for use in high volume consumer products, such as cell phones, PC cameras, toys, automotive sensors, camcorders and low cost SLR cameras. Consequently, the CMOS manufacturing technologies are largely the same as those used in manufacturing of high volume computer memory or mixed signal products. Few, if any, high volume commercial grade CMOS imaging products are manufactured using uniquely customized image sensor specific processes or complex pixel design technologies.

Although some CMOS imager foundries have begun to support unique process modifications to create specific process and design features for application specific integrated circuit (ASIC) clients, in nearly every case the custom CMOS image sensor technologies that enable these high performance applications are unique to the ASIC client, and not accessible to other users.

As will be explained in further detail below, in one aspect of this invention, improvements are provided in an APS CMOS imager which improve the dynamic range of the CMOS image sensor such that it meets or exceeds current customer expectations for imager sensitivity, response and signal to noise ratio such that it can be used for airborne imaging, especially in a military reconnaissance application.

The performance requirements for aircraft based Visible and Near Infra-Red (Vis and NIR) wavelength imaging systems mandate that solid state Vis/NIR focal plane technology enable unique capabilities unlike most commercial or consumer applications of imaging technology. Historically, CCD image sensor technology has provided the needed critical performance and configuration demanded by airborne imaging applications. However, as airborne reconnaissance systems begin to incorporate additional functionality and interoperability through reductions in size, weight, power, and cost, it is becoming increasingly difficult for CCD technology to support these objectives, due to limitations in the fundamental fabrication and operational principles of the CCD image sensor itself. Although present CMOS image sensor technology does not support the broad, demanding performance requirements currently provided by the CCD, the successful evolution of airborne reconnaissance imaging systems will rely on the adaptation of CMOS image sensor technology to enable the improvements necessary to advance the art. The present invention provides for CMOS imager design aspects which enable this result to be achieved.

In order to achieve both the stringent and contradictory performance requirements of the airborne reconnaissance grade Vis/NIR image sensor in a CMOS technology, customization of both the CMOS process and the pixel design technologies is required. To further understand the problem, it will be noted that optimum sensor performance requirements include seemingly contradictory aspects. On the one hand, each pixel in the focal plane must have a large full well electron capacity for shot noise (thermal) limited high background, large signal performance, as would be expected during the daytime with full scene illumination. However, on the other hand, each pixel must have high sensitivity and low noise for small signal extraction, in order to provide for reconnaissance capability in low light level situations, such as when shadows are present in the field of view. Therefore, aspects of the present invention provide for a novel, modified pixel design to satisfy this dynamic range dilemma.

Furthermore, present CMOS imaging technologies are optimized for photoresponse in the visible band from 450 nm to 700 nm, with the desired NIR response filtered or dramatically reduced. Customization of the CMOS process is therefore also needed to further extend the sensor response from 700 nm to 950 nm for airborne reconnaissance applications.

The embodiments of the present invention are intended to solve the contradictory dynamic range dilemma of the airborne CMOS image sensor by providing a pixel design, which achieves large well fill performance as well as high sensitivity and a high signal to noise ratio (SNR) while preserving linearity of response.

It is known in the art that CMOS active pixel sensors rely on each pixel having a charge to voltage conversion amplifier to create local voltages representative of the signal value illumination recorded at the pixel. A representative prior art CMOS pixel 10 is shown in FIG. 1A. Incident radiation 12 impinges on a photodetector 14. Collected charge is supplied to an amplifier 16. A gate 18 is clocked to direct a voltage signal on the output of the amplifier to an output multiplexer (not shown) along conductor 24. A reset gate 20 resets a transistor 22 at the output of the photodetector 14 as shown.

The typical prior art (FIG. 1A) teaches that a CMOS APS pixel contains one detector 14 and one amplifier circuit 16 per pixel. The performance of the pixel is determined by the detection, amplification, and noise performance of the single detector, single amplifier combination. Typically, most imaging applications will either fall in the category of still or video photography, or controlled light source photography. Prior art pixel design has not previously been required to provide both high sensitivity and signal to noise ratio for small signals while simultaneously providing good contrast signal to noise for small signals buried within high background illumination scenes.

FIG. 2 is an illustration of a CMOS image sensor 30 having an array 32 of CMOS pixel sensors 10, one of which is shown enlarged. The array 32 is arranged in rows and columns of pixels, perhaps 25 or 50 million in all. FIG. 2 shows a column amplifier 36 which amplifies the output voltage from the pixel sensors 10. The amplified signals are supplied to a multiplexer 34. The multiplexed output signals are amplified by an amplifier 38. The amplified signal is supplied to A/D converters and signal processing circuitry which is conventional.

FIG. 3 is an illustration of a four transistor prior art CMOS Active Pixel sensor. This design includes a global shutter transistor 40, reset transistor 22, amplifier transistor 16 and select transistor 18. By controlling the biasing of the shutter transistor 40, the accumulated charge on the photodiode detector 14 is selectively applied to the charge to voltage conversion amplifier transistor 16.

FIG. 4 is another prior art four transistor CMOS pixel design. It includes a transfer transistor 42, a reset transistor 44, charge to voltage conversion amplifier 16 and a select transistor 18 transferring the voltage signal from the output of the amplifier 16 to the conductor 24. The transfer gate transistor 42 acts in a similar fashion to the shutter transistor 40 of FIG. 3.

Prior art pixel design has addressed the extension of CMOS pixel dynamic range to accommodate large background signals by compressing the response to large signals with non-linear amplification or by subtracting signal values through down stream signal processing. The compressed response to large signals degrades the contrast signal to noise ratio for the airborne reconnaissance imaging application by reducing the contrast between the small signals present in the large background signal and the background signal itself. The associated graph shown in FIG. 1B illustrates the compromised signal handling capacity and the non linearity of the response as the illumination increases and is compressed. For example, in region 26, there is very little increase in the output signal on conductor 24 as illumination increases.

Various other methods have been employed to compress the input dynamic range including the utilization of variable detector voltage values, multiple storage of lines of signal integrated with different integration times then subtracted, logarithmic response amplifiers, anti-blooming structures to limit collected signal charge, pixel level analog to digital conversion (ADC) and gain adjustment, as well as other concepts.

Typically, the response of a visible detector is linear with respect to optical signal input to the point of either pixel well saturation or full signal swing of the detector sense node. Beyond the saturation illumination level, the response curve becomes essentially flat. See FIG. 1B. The prior art methods to extend detector dynamic range do not preserve the linear response of the detector while maintaining signal integrity for both high and low scene illumination levels.

The full well capacity of a CCD image sensor pixel is generally limited by the charge handling capacity of a gated potential well that usually has an antiblooming feature to avoid signal charge from mixing with adjacent pixels when a pixel that has reached its well saturation limit. Conversely, the saturation limit of a CMOS image sensor is typically more a complex function of the floating diffusion sense node voltage swing, photodiode storage capacity, and additional capacitances added to the pixel amplifier circuit. The critical relationship for the saturation value of a CMOS sensor pixel is $CV=Q$, where V=the useful linear voltage swing allowed at the detector sense node (reset node typically), C=the capacitance of the sense node (amplifier 16 input node) (including all parasitics), and Q=all photogenerated and thermally generated signal electrons collected and incident on the sense node.

The voltage limit at the sense node is determined by the supply voltage and the threshold of the reset transistor 22 of FIG. 1A. The largest voltage swing at the sense node for an N-channel transistor is Vdd-Vt. The practical reality is that the sense node is typically coupled to the gate of a source follower circuit, which has a range of useful input voltages for operation. Typically, the maximum useful voltage swing at the sense node of a CMOS image sensor is <60% of Vdd.

In general, the P/N junction diode photodetectors have a much higher limit for charge storage capacity than the voltage swing at the sense node will allow. The photodiode typically begins to forward bias when over-illuminated such that excess charge is swept into the substrate, thus creating a built-in antiblooming circuit.

The relationship that describes the conversion of signal charge to useful voltage signal is determined by the sense node capacitance or qe/Cnode (microvolts per electron). As the node capacitance increases, the charge to voltage gain decreases, but the dynamic range of the allowable input signal increases as Vmax is reached more slowly.

Increasing the node capacitance is the simple method for increasing the saturation charge limit for the CMOS sensor pixel. Increasing the maximum voltage swing in the sense node is another method. Unfortunately, the maximum voltage swing is limited by the maximum allowable Vdd voltage for the CMOS process design rules being used. Smaller dimension design rules dictate smaller voltages. For circuits that require small geometries for packing density and/or low voltages for low power operation, the maximum Vdd supply value scales to ever-lower values.

The effect of increasing the capacitance at the sense node is to decrease the signal to noise ratio by $1/\sqrt{C}$. Hence, for small signals, it is desirable to minimize the sense node capacitance. However, in the airborne imaging and reconnaissance application, it is also necessary to have a large charge handling capacity to improve shot noise limited signal to noise ratio (varies as $Vsignal/\sqrt{Vsignal}$) for scenes with high background signal and low contrast between target features and the background signal. For the case of optimized small signal gain, adding gain (g) to the sense amplifier while decreasing the sense node capacitance results in an increase in the signal to noise ratio proportional to $\sqrt{g}\sqrt{C}$ (in simplistic terms).

A critical requirement for airborne reconnaissance imaging systems is to have high signal to noise ratios, for both small signal and high background signal imaging conditions. As previously stated, this creates a conflict for conventional pixel design. Small node capacitance favors better small signal SNR, while large node capacitance favors better SNR for large signals. The present invention describes methods for achieving both SNR goals by utilizing novel CMOS image sensor pixel designs.

The paper "Large Area TDI Image Sensor for Low Light Level Imaging," M. Farrier and R. Dyck, IEEE Transactions on Electron Devices, Vol. ED-27, No. 8 (August 1980), discloses a dual amplifier in an image sensor for the purpose of increasing the useful input dynamic range. The paper discusses the development of a CCD TDI image sensor capable of imaging in very low light conditions (starlight at 0.001 lux) to full daylight scene illumination. The image sensor utilizes CCD technology (not CMOS technology) with a pixel a storage capacity of approximately 1 million electrons, which is adequate for high background imaging conditions. To achieve low light level imaging with low noise performance, the CCD output shift register is created with two floating gate type sense nodes and two output amplifier structures. The large capacity sense node is positioned upstream and signal charge is transferred through the floating gate and detected by the second small signal (low capacitance) floating gate sense node. The excess signal beyond the well capacity of the small floating gate node is drained away, effectively clipping the large signals to 10% of the total full well value of the sensor.

The amplifiers attached to the two floating gate nodes both have inverter gain stages. The wide dynamic range amplifier is designed to operate over a wide input range with a lower charge to voltage conversion. The second amplifier attached to the small capacitance sense node is designed to provide high conversion gain with a limited output swing. System operation allows for recording signal from both amplifiers nearly simultaneously such that small signals can be extracted at the same time large signals are accommodated.

The patent literature describes various attempts to increase the dynamic range of a CMOS imager. See the following patents, which are incorporated by reference herein: U.S. Pat. Nos. 6,486,504; 6,011,251; 6,757,018; 6,734,905; 6,710,804. See also *Wide Intrascene Dynamic Range CMOS APS Using Dual Sampling*, O. Y. Pecht, et al., IEEE Transactions on Electron Devices, Vol. 44, No. 10 (October 1997). None of the art of which the inventor is aware teaches or suggests the novel CMOS APS features of this invention.

SUMMARY OF THE INVENTION

In a first aspect, an improved CMOS imaging array is provided comprising a plurality of individual pixel elements arranged in rows and columns. Each pixel in the plurality of individual pixels is of the same design and includes:

a) a photodetector receiving incident light and generating an output;

b) a first relatively lower gain, wide dynamic range amplifier circuit responsive to the output of the photodetector, the first circuit optimized for a linear response to high light level input signals;

c) a second relatively higher gain, lower dynamic range amplifier circuit responsive to the output of the photodetector, the second circuit optimized to provide a high signal to noise ratio for low light level input signals;

d) a first output select circuit for selectively directing the output of the first amplifier circuit to a first output multiplexer; and e) a second output select circuit for selectively directing the output of the second amplifier circuit to a second output multiplexer;

wherein separate outputs of the first and second amplifier circuits are provided for each of the individual pixels of the CMOS imaging array.

In an alternative embodiment, each pixel includes two photodetectors receiving incident light and generating an output. The pixel includes a first relatively lower gain, wide dynamic range amplifier circuit responsive to the output of the first photodetector, the first circuit optimized for a linear response to high light level input signals, and a second relatively higher gain, lower dynamic range amplifier circuit responsive to the output of the second photodetector, the second circuit optimized to provide a high signal to noise ratio for low light level input signals.

In yet another aspect of the invention, a method is provided of imaging a scene with a CMOS imaging array comprising a plurality of pixels arranged in rows and columns. The method includes performing the following steps in each pixel: a) directing scene illumination onto a photodetector; b) supplying charge from photodetector through a transfer gate to a relatively low gain, wide dynamic range amplifier circuit coupled to the photodetector and generating a first output; c) supplying charge from the photodetector to a relatively high gain, limited dynamic range amplifier circuit coupled to the photodetector and generating a second output signal; and d) clocking a first output select gate and a second output select gate so as to separately transfer the first output signal of said first amplifier circuit and the second output of the second amplifier circuit to a first output multiplexer and a second output multiplexer, respectively.

In a modification to this aspect of the invention, the method can comprise the steps of a) directing scene illumination onto a first photodetector and a second photodetector; b) supplying charge from the first photodetector to a relatively low gain, wide dynamic range amplifier circuit coupled to the first photodetector and generating a first output; c) supplying charge from the second photodetector to a relatively high gain, limited dynamic range amplifier circuit coupled to the second photodetector and generating a second output signal; and then performing the clocking as recited above.

The disclosed preferred embodiment applies the concept of providing two amplifier circuits within each pixel to achieve both small signal and large signal wide dynamic range performance. The present invention is clearly distinguished and provides improvement over the known prior art through novel design and application of CMOS image sensor technology at the pixel level.

In particular, aspects of this invention improve upon the CCD associated prior art (e.g., in the Farrier et al. IEEE article), by devising a method for integrating signal charge at one or more integration sites within a CMOS pixel, separately sensing charge at different resetable sense nodes in the amplifier circuits within a CMOS pixel, and reading out signals from both of the amplifier circuits during the same frame (entire array) readout period.

Unlike CCD image sensors, the CMOS APS sensor is an X-Y addressable array of photodetectors and the two voltage conversion elements may act independently as detectors and can be addressed individually. Conversely, a CCD detector is typically a temporary capacitor created by a voltage applied to a gate. The CCD detector cannot output a signal individually from any fixed location. The signal charge generated in that pixel capacitor must be transferred, generally in a parallel/serial clocking scheme to an output device that converts the signal charge to a voltage at a single output node.

In still another aspect, a CMOS image sensor is disclosed that uses multiple photodetectors per pixel, and in which each photodetector accumulates charge after the radiation has passed through separate color filters, one per photodetector. This embodiment can be used for separate three color imaging (e.g., using Red, Green and Blue color filters and separate Red, Green and Blue photodetectors). Each pixel also includes first, second and third amplifier circuits which are coupled to the first, second and third photodetectors, respectively, providing first, second and third output signals. The first, second and third amplifier circuits are optimized for detector outputs of said first second and third photodetectors, respectively.

The present invention is unique compared to prior art since it provides a CMOS APS pixel incorporating two distinct and differently performing amplifier circuits within each pixel, and that each pixel can stand alone as an individually accessible detector element in a larger array of detector elements.

BRIEF DESCRIPTION OF THE DRAWINGS

Presently preferred embodiments of the invention will be discussed below in conjunction with the appended drawing figures, wherein like reference numerals refer to like elements in the various views, and wherein:

FIG. 11 also shows the typical prior art CMOS pixel response, e.g., for the pixels of FIGS. 1-4.

FIG. 14 is a top view of a front-side illuminated pixel with a high gate count using the design rule of FIG. 13 and a smaller pixel pitch.

DETAILED DESCRIPTION OF REPRESENTATIVE PREFERRED AND ALTERNATIVE EMBODIMENTS

Figure 5A:
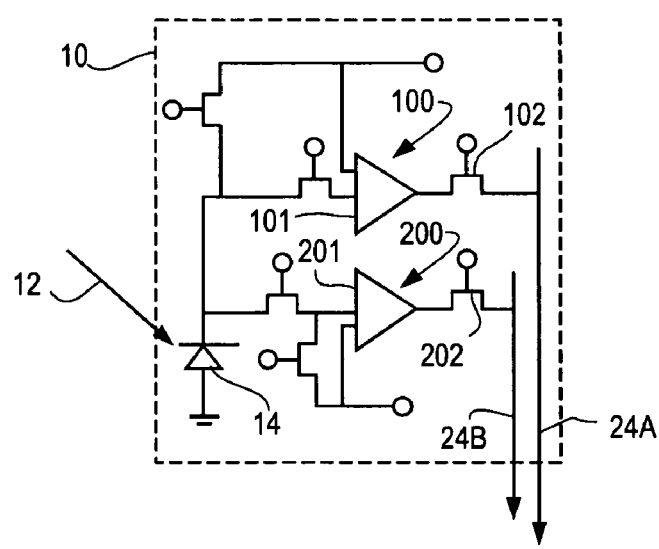
FIG. 5A is an illustration of a single photodiode and two charge to voltage conversion circuits within a CMOS pixel in accordance with one embodiment of the present invention. One circuit is optimized for large signal operation while the other circuit is optimized for small signal operation.
Figure 6:
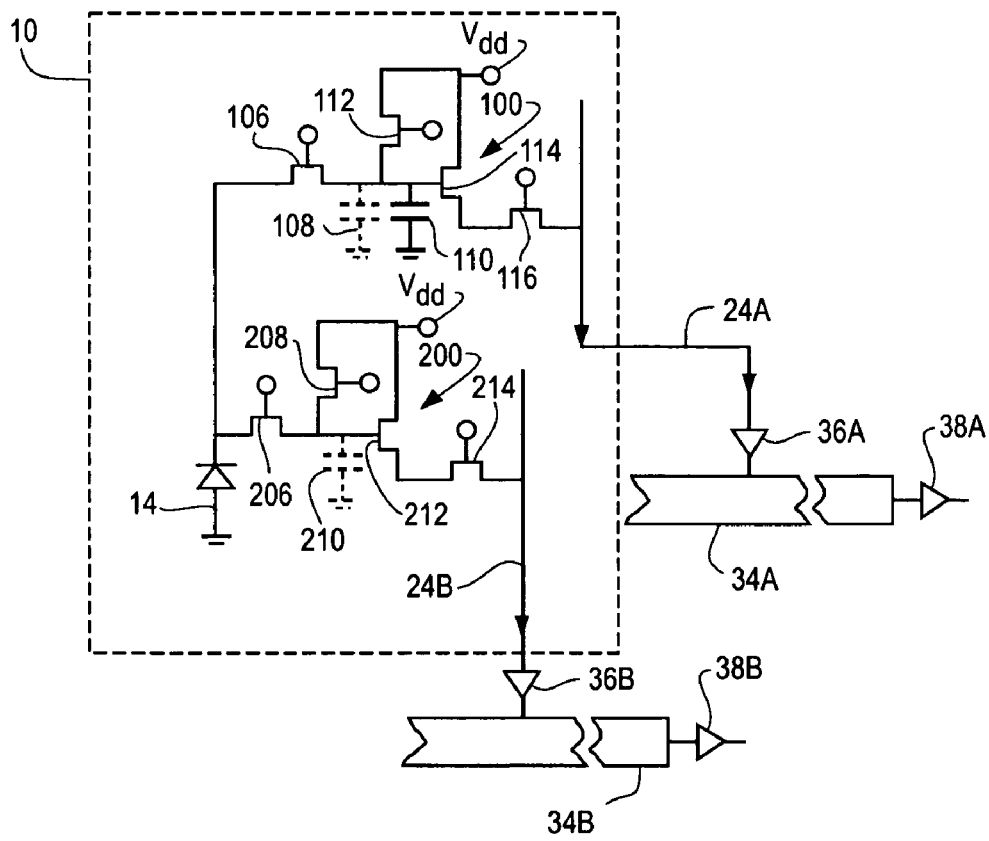
FIG. 6 is an illustration of a CMOS active pixel sensor in accordance with another embodiment of the present invention. This embodiment includes a single photodiode detector coupled to two transfer gates and two charge to voltage amplifier circuits in parallel. As in the case of FIG. 5A, one circuit is optimized for large signal operation while the other circuit is optimized for small signal operation.

In a first aspect, an improved CMOS imaging array is provided comprising a plurality of individual pixels arranged in an array of rows and columns of individual pixels. The number of pixels can vary, but embodiments of 25 and 50 million pixels are considered exemplary. Each pixel in the plurality of individual pixel sensors is preferably the same. A representative example of the CMOS pixel sensor 10 is shown in FIG. 5A. The pixel sensor includes the following elements:

a) A photodetector 14 receiving incident light 12 and generating an output (accumulated charge).

b) A first relatively lower gain, wide dynamic range amplifier circuit 100 responsive to the output of the photodetector 14, the first circuit 100 optimized for a linear response to high light level input signals. The amplifier circuit 100 may also function as a charge to voltage conversion circuit.

c) A second relatively higher gain, lower dynamic range amplifier circuit 200 responsive to the output of the photodetector 14, the second circuit 200 optimized to provide a high signal to noise ratio for low light level input signals. The second circuit may also function as a charge to voltage conversion circuit.

d) A first output select circuit 102 comprising, in the preferred embodiment a transistor gate for selectively directing the output of the first circuit to a first output multiplexer (not shown in FIG. 5A, see 34B in FIG. 6).

e) A second output select circuit 202 comprising a transistor gate for selectively directing the output of the second circuit to a second output multiplexer (not shown in FIG. 5A, see 34A in FIG. 6).

Separate voltage signal outputs of the first and second circuits 100, 200, respectively are provided for each of the individual pixel sensors of the CMOS imaging array. In particular, the voltage output from the first circuit is optimized for high light level conditions with wide dynamic range, and the voltage output from the second circuit is high gain, optimized for low light level condition, with less dynamic range but with high signal to noise ratio.

The CMOS active pixel sensor is designed with CMOS processing technology for enhanced dynamic range and signal integrity by utilizing two distinct detection processes and two charge to voltage conversion amplifier circuits 100, 200 within the unit cell of each CMOS pixel 10. The detector 14 is combined with two amplifiers 101, 201 to supply two separate voltage outputs on conductors 24A, 24B from each pixel. In an alternate embodiment (see FIG. 9), two detectors are combined with the two amplifiers. In either case, the two output signals can be read out simultaneously, line sequentially, or frame sequentially. The use of two outputs from the first and second circuits provides for optimal signal conditioning and performance for both high level and low level optical input signals that are incident on the CMOS image sensor within the same imaging frame and within the same integration or exposure period. One amplifier output voltage (amplifier 201) is optimized for best signal to noise ratio for low light level input signals. The second output amplifier voltage (amplifier 101) is optimized to provide a linear response to large light level input signals, such that the signal to noise ratio for small signals of interest residing in an area of large background scene illumination will be improved by shot noise limited imaging principles. The present invention solves the problem of providing both extended linear dynamic range for enhanced contrast signal to noise and high sensitivity for low light level content in the image.

Figure 5B:
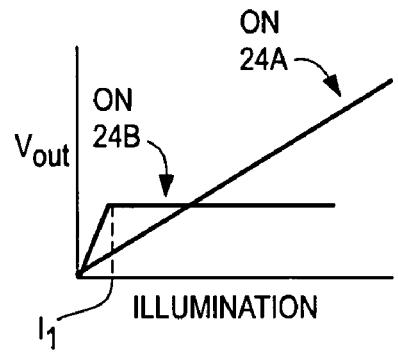
FIG. 5B is a graph of the output signal response from the two charge to voltage conversion circuits as a function of scene illumination.

The graph shown in FIG. 5B illustrates the improvement provided by the present invention where the image sensor signal performance is optimized for both large and small signals without degradation to linearity or SNR. Also note the well capacity for the pixel of the present invention is superior to the prior art since the node capacitance can also be optimized. In particular, the output of the first circuit 100 on conductor 24A of FIG. 5A produces a linear response at high illumination levels as shown in FIG. 5B. However, the output of the second circuit 200 on conductor 24B shows a high signal response at low illumination levels. While this response becomes non-linear and flat at illumination level I, this is of no great concern since the signal output from the first circuit can be selected to produce a linear response at this and higher levels of illumination.

The preferred embodiments of this invention provide for charge detection, charge transfer, and charge conversion structures within each pixel sensor of the CMOS imaging array. There are several motivations for creating these various embodiments due to pixel area constraints, noise performance optimization, sensor yield, pixel fill factor, as well as other considerations. As an example of an alternate pixel technology, a pinned photodiode or PPD detector technology can be applied to replace the p/n junction photodiode technology of the preferred embodiment.

An alternative embodiment of the present invention is described in the circuit diagram of FIG. 6. The circuit consists of a reverse biased photodiode 14 detecting optical radiation in the visible and near infrared spectra, and two charge to voltage amplifier circuits, 100 and 200. The first amplifier circuit 100 consists of a transfer gate 106, Capacitance Node (Cnode) 108, capacitor 110, reset transistor 112, source follower transistor 114 and output selection gate 116. The second amplifier circuit 200 consists of a transfer gate 206, reset gate 208, Cnode 2 (210), source follower transistor 212 and output selection gate 214. The amplifier circuit 100 is designed to optimize signal to noise performance for large signals. The amplifier circuit 200 is optimized for small signals and low light level conditions. The optimization is achieved, in part, by adjusting the capacitances at Cnode 1(108), capacitor 110, and Cnode 2 (210). Transfer gates 106 and 206 are positioned between the photodiode detector 14 and the two resettable floating diffusion capacitors Cnode 1(108) and Cnode2 (210) and serve to isolate each amplifier 114 and 212 from the photodiode 14. Each of the floating diffusion nodes is reset to the voltage Vdd by a separate reset transistor 112, 208. Cnode 1 is reset by transistor reset 112 and Cnode 2 is reset by transistor reset 208. The total capacitance on each of the floating diffusion nodes Cnode 1 and Cnode 2 consists of photodiode to substrate capacitance, gate overlap capacitance, and parasitic capacitances from the process layers used to construct the interconnection layers. In some cases, additional capacitance may be added to the floating node Cnode 1 through additional circuit elements such as poly to poly capacitors, as indicated by capacitor 110 in circuit 100.

In this embodiment of the present invention, the capacitances at the floating diffusion sense nodes of the two circuit paths Cnode 1 (108) and Cnode 2 (210) are designed to be different values. Cnode 1, for example, could be approximately equal to the capacitance of the photodiode detector 14 and therefore capable of accommodating the signal charge associated with the largest signal integrated at the photodiode detector. Extra capacitor 110 is optional. The second capacitance Cnode 2 (210), in contrast, is then made substantially smaller in value than Cnode 1 or that of the photodiode detector 14, and therefore could provide larger charge to voltage conversion gain than that of the circuit 100. The larger charge to conversion gain and small capacitance provided by Cnode 2 (210) provide optimized small signal response and high signal to noise ratio (SNR). The source-follower amplifier transistors 114 and 212 are designed with differing physical layouts (W/L ratios) to optimize the signal to noise performance for each circuit's performance objective. Cnode 1 (108) and Cnode 2 (210) are shown in dashed lines in FIG. 6 to indicate that they may represent inherent capacitance of the sensor substrate, gate overlap capacitance, and parasitic capacitance and need not consist of an additional physical capacitor.

Each of the two amplifier circuits 100 and 200 has a separate source follower output transistor 114 and 212 and associated gate transistor 116 and 214 for selecting the output of either amplifier 114 or 212. Source follower amplifier 114 is selected by selector gate transistor 116 which then drives external column amplifier 36A for readout by the external output multiplexer 34A. Source follower amplifier 212 is selected by selector gate transistor 214 which then drives external column amplifier 36B for readout by external multiplexer 34B. In this embodiment, separate column lines 24A and 24B are utilized and are separately selected corresponding to the amplifier output signal of choice. Each column output is directed to a separate column amplifier 36A, 36B then to a separate multiplexing circuit (34A, 38A) (34B, 38B) as shown in FIG. 6. Each column amplifier 36A, 36B design is optimized for signal to noise performance for each of the two signals generated. Those skilled in the art may also recognize that the two signals could be combined, using another multiplexing switch, into a single output multiplexer circuit to simplify the design.

The operation of each amplifier circuit 100 and 200 in the embodiment shown in FIG. 6 as follows. The amplifier sense node voltages are reset through the reset transistors 112 and 208. Integration of signal charge occurs at the photodiode 14 when optical signal (illumination) is present. The photodiode signal charge is transferred to the sense node (Cnode) 1 (108) and/or Cnode2 (210) through transfer gates 106 and/or 206. Charge is converted to voltage at the source follower transistors 114 and 212. The signal voltage is scanned by random access scan clocks such that a line sequential parallel/serial readout of the image frame is achieved by the operation of the output select circuits (select gates 116 and 214, associated output conductors 24A and 24B) and the column amplifiers 36A and 36B and multiplexers 34A and 34B.

In the embodiments of this invention, the integration cycles for each of the two circuits 100 and 200 may be set for the same duration but staggered by one integration time, or alternatively, set for different integration times staggered by either the shorter or longer integration time. This operation would be dependent on the system clocking and influenced by scene illumination and feedback from the down stream signal processing. If the integration and readout times of the images from the two circuits 100 and 200 are separated, it is possible to obtain useful information regarding image motion within the imaged scene. The transfer gates 106 and 206 would not be turned on simultaneously, but would be alternating during the composite integration time. The user would have the option of integrating and transferring signal through the output multiplexers in any of three modes: 1) Simultaneously, 2) Line interlace mode, or 3) Alternate frame mode.

The simultaneous readout mode affords the user the ability to extract both large signal and small signal information from the image scene within the shortest time interval between integration periods; image motion effects between the two scene samples would be minimized. Another technique is line sequential, meaning that a line of data from amplifier 1 is read out through the multiplexer followed by a line of data from amplifier 2, and alternating in that way throughout the frame of imagery. Another alternative is frame sequential, meaning that data is read out from amplifier 1 only during a first frame, and then data is read out from amplifier 2 during a second frame. Image data could be from the same integration time, or it could be from different integration times. Using either the line sequential or frame sequential methods would require faster readout multiplexers to maintain higher frame rates. In particular, if two multiplexers are running simultaneously at rate F, as in the preferred embodiment, one frame of data can be read out in time X. If the output multiplexers are operated singly at rate F, the frame of data requires 2X time to read out. Alternately, if the multiplexers are clocked at a rate 2F, the total time to read out a frame of data from two multiplexers alternately is X, just as in the case of reading the two multiplexers simultaneously.

Combinations of the two output frames could be selected such that both small signal performance in low light level portions of the scene and low contrast high signal performance can be optimized within the same scene, taken in a snapshot or global shutter mode. An additional benefit to combining or comparing two frames integrated at nearly the same time or within a precisely measured time period is that objects moving at a rate that is discernable within relatively short integration times may be accurately measured such that the velocity of the object may be precisely determined.

Figure 1A:
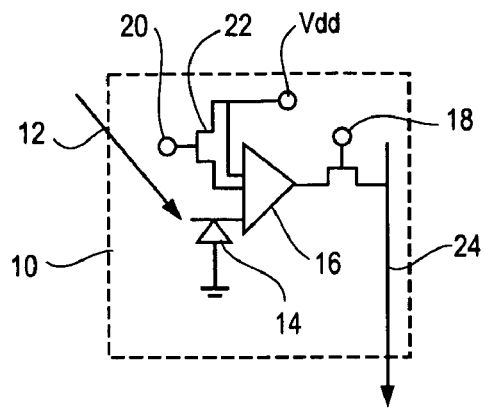
FIG. 1 illustrates a typical prior art 3 transistor CMOS APS pixel design using a single photodiode and a single output amplifier.
Figure 1B:
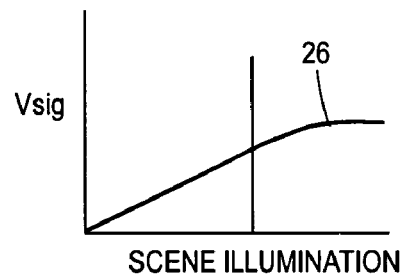
Figure 2:
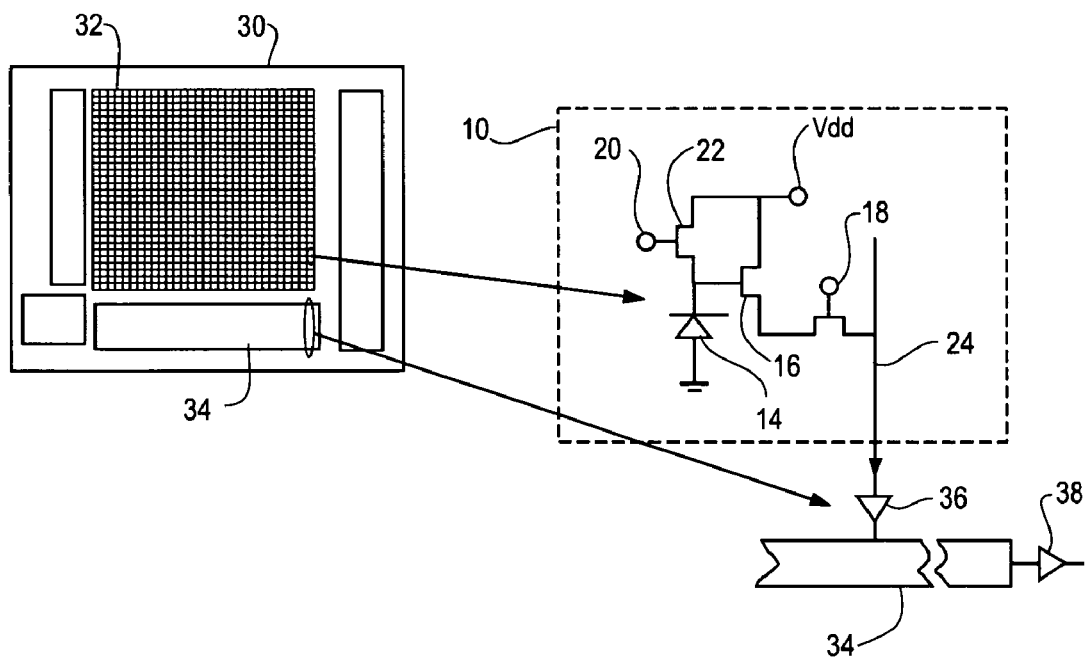
FIG. 2 depicts a typical CMOS APS sensor integrated circuit (IC) architecture with an exploded view of a pixel and the attendant column readout structure. The typical CMOS APS IC consists of several circuit blocks that control the clocks and biases applied to the pixels in the pixel array.
Figure 3:
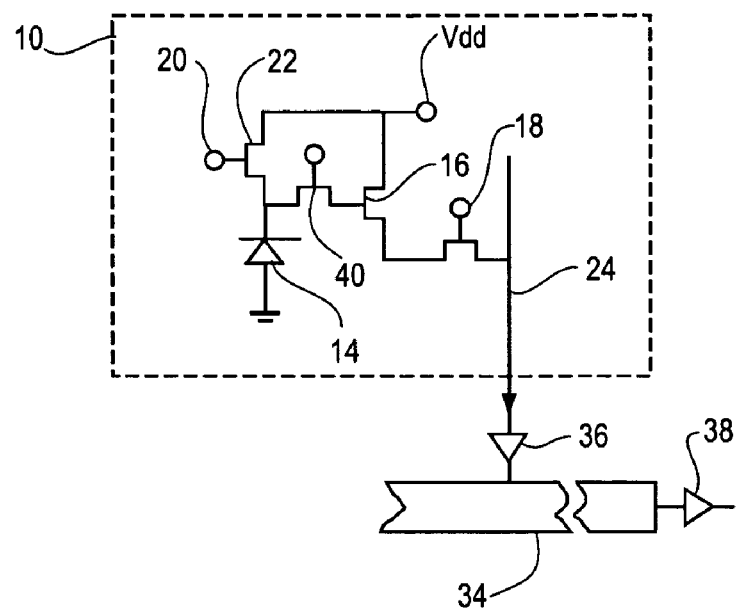
FIG. 3 is an illustration of a second common prior art CMOS pixel design that utilizes a transistor 40 for electronically controlling the exposure of all pixels simultaneously (globally).
Figure 4:
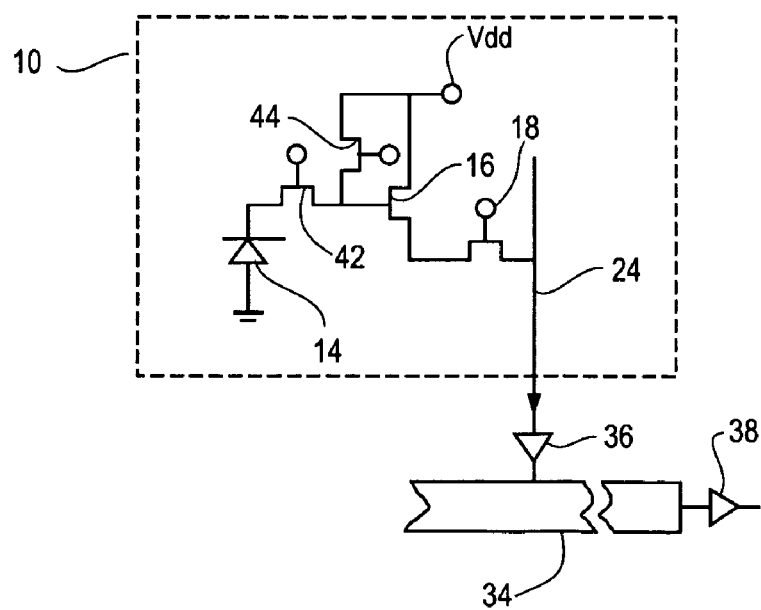
FIG. 4 is an illustration of a third prior art CMOS pixel design that includes a transfer gate 42 between the photodiode and the sense node of the charge to voltage amplifier 16. This transfer gate 42 is also used for electronically controlling the exposure of the pixels globally and for isolating the sense node from the photodetector.
Figure 7:
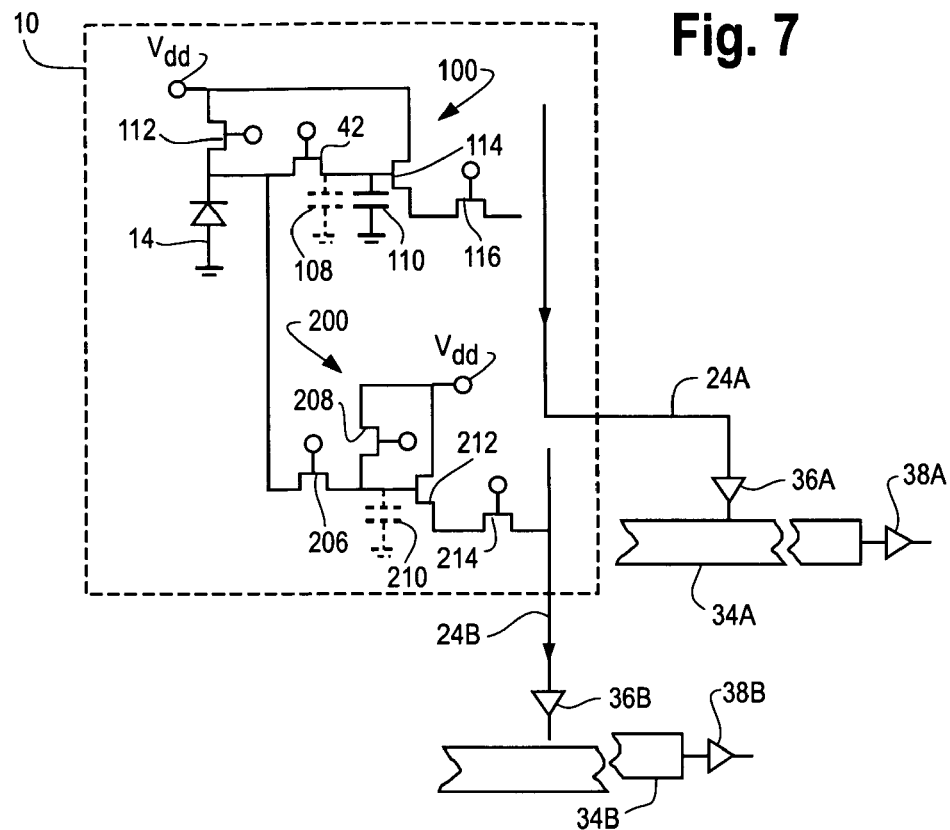
FIG. 7 is an illustration of a second embodiment of the invention. The new pixel design is again composed of two separated charge to voltage amplifier circuits with one circuit operating in the manner of FIG. 3 with a shutter gate, and the other circuit operating in the manner of FIG. 4 with a transfer gate for isolation.

FIG. 7 illustrates an alternative embodiment of the present invention which is a variation of the embodiment depicted in FIG. 6. The embodiment of FIG. 7 combines an electronic shutter gate transistor 42 of the prior art shown in FIG. 4 into the large signal wide dynamic range amplifier circuit 100, while retaining the transfer gate shutter transistor 206 for the small signal amplifier circuit 200 as depicted in FIG. 6. The design architecture embodied in FIG. 7 enables the photodiode 14 and sense node capacitance to be combined (Cnode 1 (108) plus photodiode 14 capacitance Cpd). The advantage of this configuration is that it reduces the signal lag through the transfer gate 42 for the case where the photodetector is a p/n junction photodiode as opposed to a pinned photodiode. Extra sense node capacitor 110 is optional.

Figure 8:
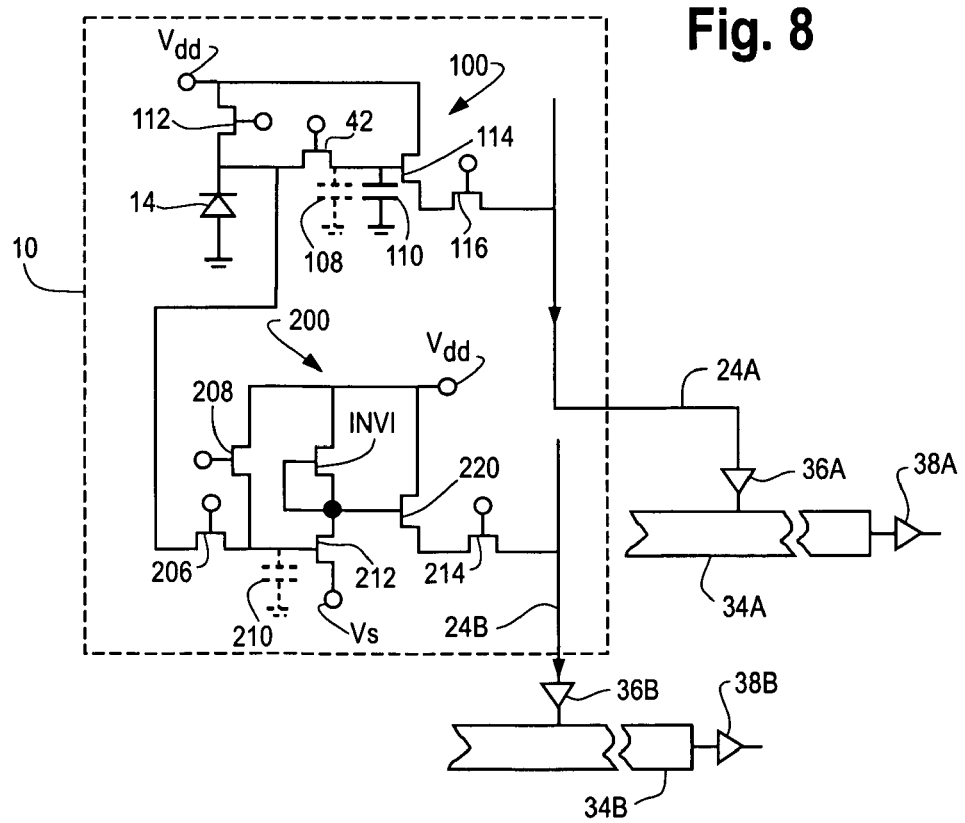
FIG. 8 is an illustration of a modification of the embodiment of FIG. 7, in which there is the addition of an NMOS inverter in the second amplifier circuit. The inverter stage is intended to provide additional small signal gain.

FIG. 8 shows the pixel 10 circuit design for a third embodiment of the invention. The circuit contains a first charge to voltage amplifier circuit 100 configured with the same elements as shown in FIG. 7 and functioning as a large signal, wide dynamic range amplifier utilizing the combined photodiode 14 capacitance Cpd and sense node, Cnode 1 (108) capacitances and optional capacitor 110 with shutter gate 42 between the source-follower transistor M1 (114) and the detector/sense node, Cnode 1, (108) and having output selector gate 116. However, the second charge to voltage amplifier circuit 200 has been reconfigured. Transfer gate 1 (206) remains connected to the photodiode 14 on one side and to reset gate 208, Cnode 2 (210) and transistor amplifier 212 on the other side. However, transistor 212 has now been configured with transistor INV1 to function as an inverting amplifier. Transistor 220 has been added as a source follower to isolate the inverting amplifier INV1 from output transfer gate 214 and subsequent column amplifier 36B. The inverter gain is controlled by the voltage Vs and the W/L layout ratios of INV1 and transistor 212 such that the voltage output signal gain is improved over the typical source-follower gain of 0.7<g<0.85. However, it must be pointed out that the inverter performance characteristics can become non-linear at the extremes of the operating voltage range. Attention to the inverter design is necessary since this non-linearity can have a negative affect on fixed pattern noise correction and other signal processing applications.

For small input signals, the signal to noise ratio of the inverter gain amplifier circuit (212 and INV1) is improved by the ratio of $\sqrt{g}$ /$\sqrt{Cnode2}$ compared to a pixel circuit not optimized for small signal gain. Since the capacitance of the small signal amplifier circuit is low, the maximum allowed signal charge for that node is dictated by the CV=Q relationship, and is typically limited to 20% to 30% of the optimized signal capacity of the large signal wide dynamic range amplifier circuit, which can accommodate the full signal charge capacity of the detector photodiode.

Figure 9:
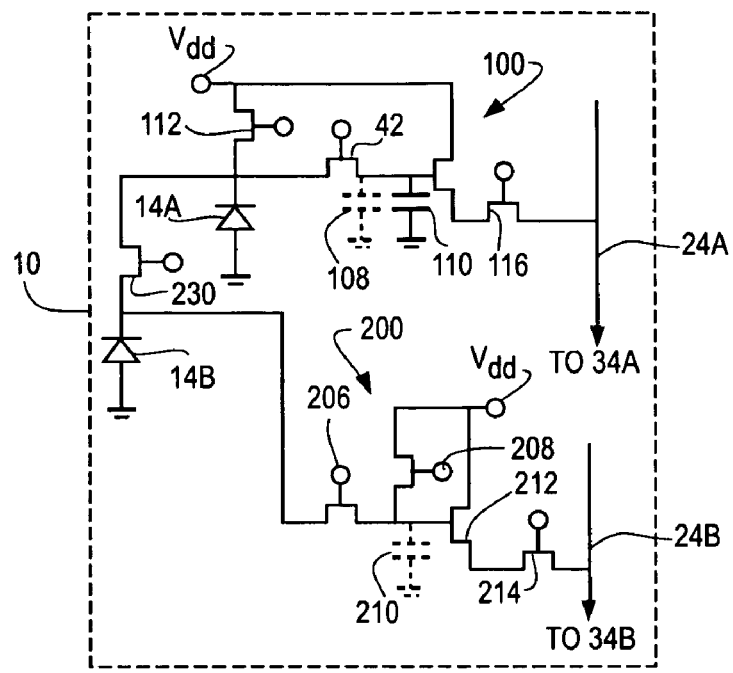
FIG. 9 is an illustration of an alternative embodiment to FIGS. 5-8, wherein two photodetectors (e.g., photodiodes) are used within each CMOS pixel such that one photodiode provides a signal to a first charge to voltage amplifier circuit and the second photodiode provides signal to a second charge to voltage amplifier circuit.

Those skilled in the art will also recognize that it is possible to implement the pixel architecture of any of the embodiments shown in FIGS. 6, 7, and 8 using two separate photodiode detectors within the pixel sensor 10 such that each amplifier (114, 212) has its own photodetector. An example of a dual photodiode detector embodiment is shown in FIG. 9. Basically, in this embodiment, a CMOS imaging array is provided with a plurality of individual pixels 10. Each pixel in the plurality of individual pixels comprises a first photodetector 14A receiving incident light and generating an output and a first relatively lower gain, wide dynamic range charge to voltage amplifier circuit 100 responsive to the output charge of the first photodetector 14A, the first circuit 100 optimized for a linear response to high light level input signals. Each pixel 10 further includes a second photodetector 14B for receiving incident light and generating an output charge and a second relatively higher gain, lower dynamic range charge to voltage amplifier circuit 200 responsive to the output of the second photodetector, the second circuit 200 optimized to provide a high signal to noise ratio for low light level input signals. A first output circuit (116, 24A) is provided for directing the output of the first circuit 100 to a first output multiplexer 34A provided for the imaging array. A second output circuit (214, 24B) is provided for directing the output of the second circuit 200 to a second output multiplexer 34B provided for the imaging array. Accordingly, separate outputs of the first and second circuits are provided for each of the individual pixels in the imaging array. A mix gate 230 is shown in FIG. 9 which allows charge from photodiode 14B to be accumulated with the charge from photodiode 14A in the first circuit 100. The other elements as shown in FIG. 9 are as described previously in FIG. 7. The mix gate 230 allows the output of the two photodetectors to be combined to act as a single photodetector, with a combined detection area of the two individual photodetectors. The output of the combined photodetectors from the mix gate is supplied to both the first and second amplifier circuits.

Figure 10:
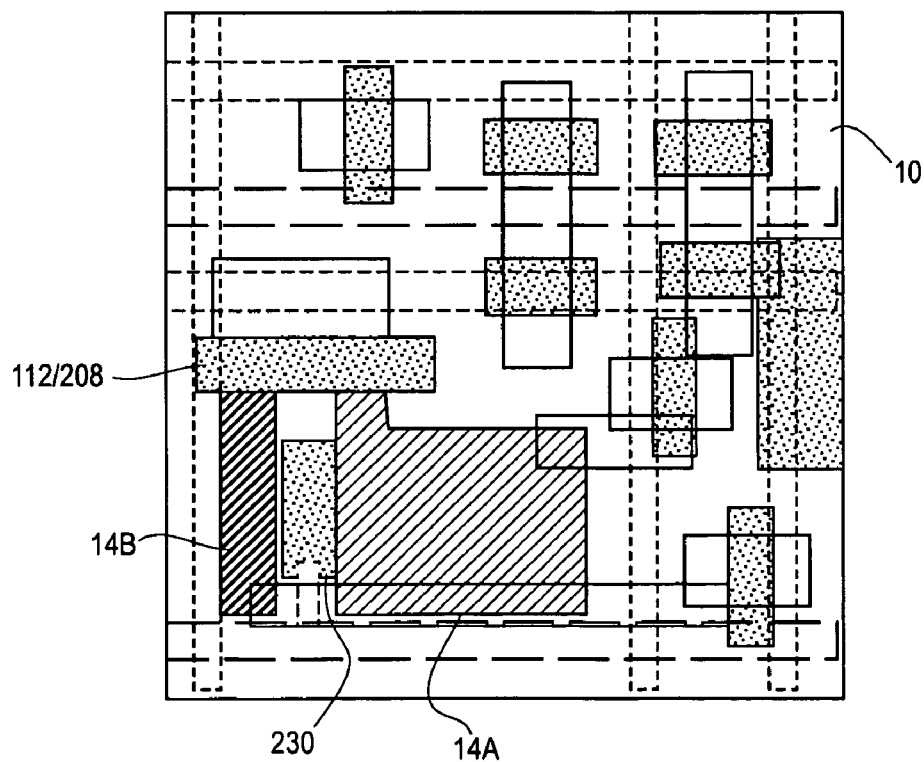
FIG. 10 is a plan view of the semiconductor layout for the embodiment of FIG. 9.

FIG. 10 is a layout view of a CMOS APS pixel 10 with drawn geometries that represent transistor gates, drains, sources, electrical interconnects, and photodiodes. The figure is representative of the masking features in a layout of a CMOS APS pixel with two photodiodes and two pixel amplifiers, but is not an actual pixel layout. Shown in the Figure is a possible configuration of two photodiode detectors, 14A and 14B, separated by a mix gate 230. Photodiode 14A is larger in area than photodiode 14B and the connect gate could be used to isolate the two photodetectors for separated integration and output functions or to combine the integrated signals from both of the photodiodes.

Figure 11:
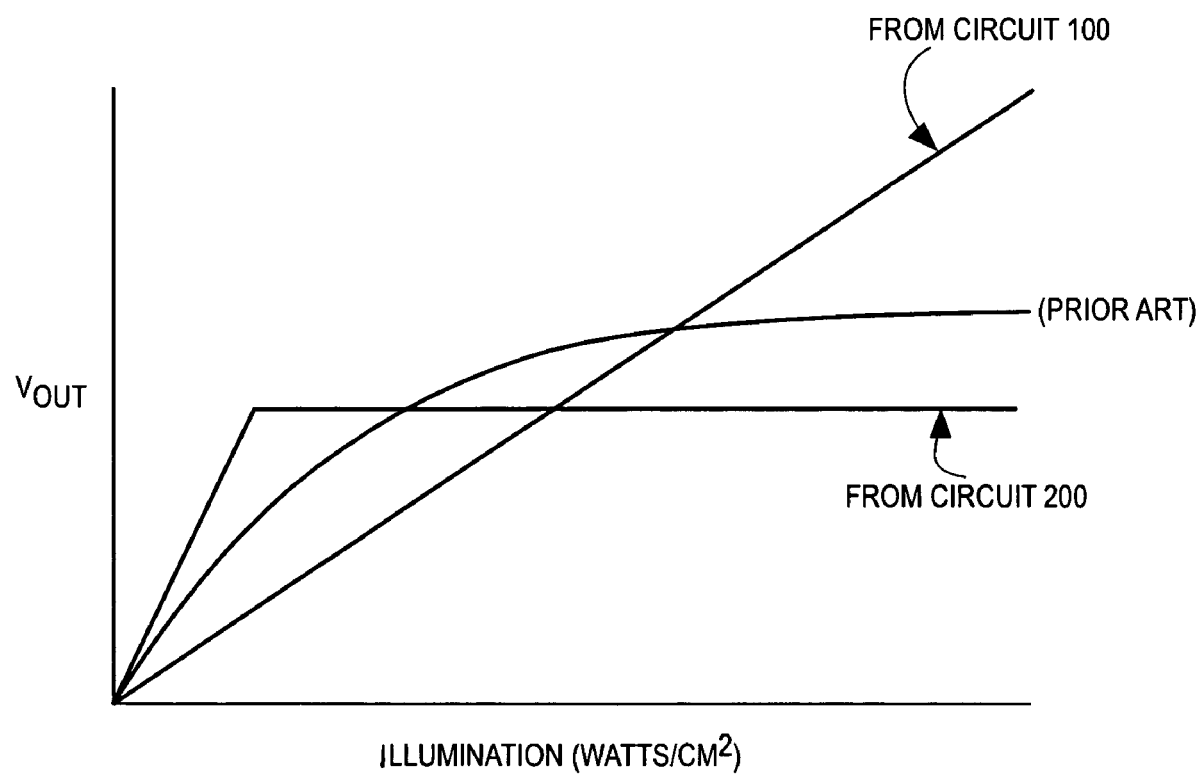
FIG. 11 illustrates the response of each of the two charge to voltage amplifier circuits within each CMOS pixel in accordance with the embodiments of FIGS. 5-9 of the present invention, showing both high signal to noise ratio and good signal response for low illumination from one circuit and a linear signal response for higher illumination scenarios from the other circuit.

FIG. 11 graphically depicts the relationship of the input optical illumination level incident on the photodiode detector and the analog voltage output seen at the output of the pixel charge to voltage conversion amplifier. The two lines labeled 100 and 200 represent the output characteristic of the two amplifier circuits 100 and 200 described above in the embodiments of the invention. Line 100 represents the response to input illumination that the amplifier with extended linear dynamic range generates while line 200 represents the response to input illumination that the high sensitivity amplifier circuit generates. The high sensitivity amplifier generates larger signals for small input illumination, while the wide dynamic range amplifier generates linear response to large signals. The prior art curve represents pixel and imaging system designs that incorporate circuits that extend the input dynamic range by creating a logarithmic or compressed response to large input illumination. In the prior art embodiments, small signals can be detected with relatively high sensitivity, however, large signal response is compressed such that the variation or contrast of signals in scenes of large illumination magnitude is reduced.

A disadvantage of using two photodiodes in a front-side illuminated CMOS pixel is that the pixel fill factor is reduced. The importance of fill factor is discussed below.

As shown in FIGS. 6 and 7, one embodiment of the present invention requires that the pixel contain as many as eight (8) transistors, while the embodiment shown in FIG. 8 requires ten (10) transistors. It is desirable to use the minimum necessary number of transistors in a pixel so that the pixel may be compacted to the smallest pitch allowed by the CMOS process design rules and practical optics limitations. The photodiode detector generally requires a 50% to 60% unobstructed area within the pixel for optical input to be sufficiently absorbed. The efficiency or responsivity of the detector is critically dependent on the open photodiode area and is known in the industry as "fill factor". To maintain a constant acceptable fill factor for a CMOS image sensor while the gate or transistor count increases, generally requires the process design rule dimensions to decrease and the supply voltages to decrease, causing the process complexity to increase. If the process technology utilized does not support an increased gate count while maintaining an adequate fill factor, the pixel dimensions must increase to accommodate. For example, a 10 micron by 10 micron pixel, with four transistors (4T), designed using a minimum feature size of 0.35 microns will maintain a fill factor of approximately 50%. Using the same technology and pixel pitch but adding four more transistors (8T) would shrink the fill factor to less than 10%, which is unacceptable unless the sensor is constructed with very small design rules or as a backside illuminated image sensor. In the backside illuminated pixel case, the frontside fill factor is not a consideration since the fill factor of the photodiode aperture is nearly 100%. Therefore one further embodiment of the present invention is to configure the CMOS image sensor with dual amplifier pixel circuitry as a backside illuminated detector array. See FIG. 13 and the discussion below.

Figure 12A:
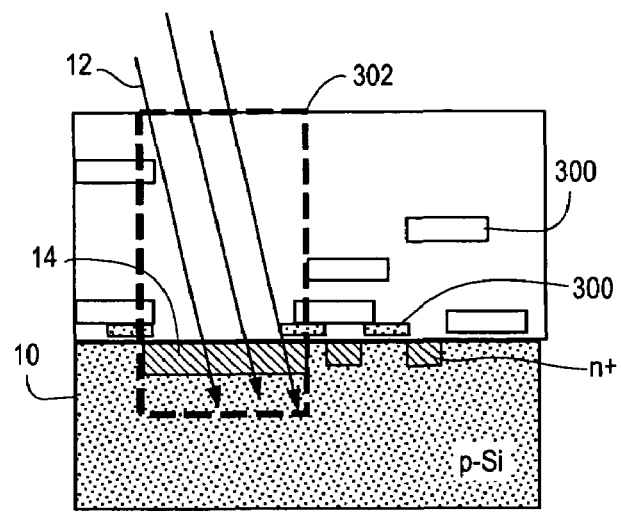
FIG. 12A is a cross section of a CMOS pixel in accordance with FIG. 5A with a front side illumination.

For the case where the eight transistors are incorporated into a frontside illuminated CMOS array, either the CMOS technology design rule must shrink (to 0.18 micron or less) for the 10 micron pixel example, or the pixel size must grow to approximately 14 microns by 14 microns, to assure adequate fill factor. Hence, each embodiment of the present invention either requires advanced CMOS processing technology, backside illumination sensor technology, or pixel enlargement in order to be implemented FIG. 12A is a cross section of a CMOS pixel 10 showing the fill factor restriction for a front-side illumination indicated at 12. The illumination 12 impinges on the p/n junction photodiode detector 14 which is embedded in a p-Si substrate. Polysilicon transfer and reset gates, metal bus wires, and other circuit elements in the pixel sensor 10 are shown by rectangular boxes 300. The area bounded by the box 302 represents the area available for conversion of illumination to charge by the detector 14. The fill factor is about 30-40%.

Figure 12B:
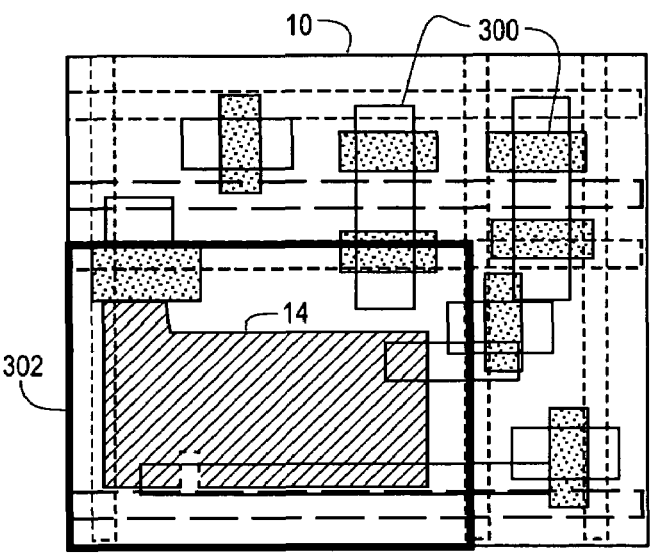
FIG. 12B is a top plan view of the CMOS pixel layout for the design of FIG. 12A. Note the relatively large pixel area needed for an acceptable fill factor.

FIG. 12B is a plan (layout) view of the pixel 10 of FIG. 12A. The pixel is frontside illuminated with a high gate count in accordance with a design rule "A". A larger pixel pitch (total pixel size) is needed to achieve an acceptable fill factor of 30-40%.

Figure 13:
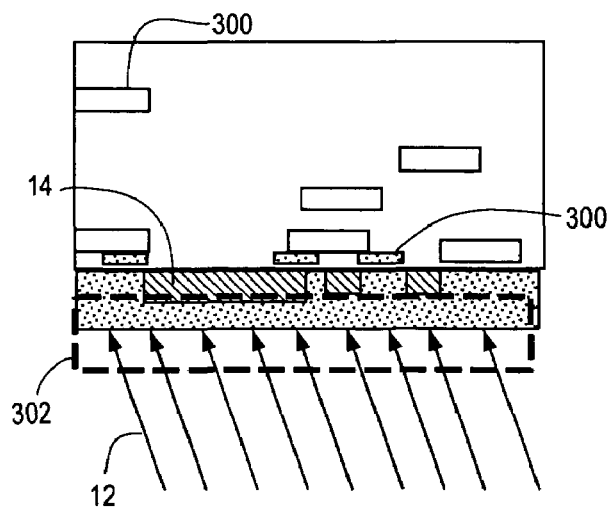
FIG. 13 is a cross-section of a CMOS pixel with backside illumination in accordance with an alternative embodiment of the invention.

FIG. 13 is a cross section of a backside illuminated pixel 10 in accordance with one embodiment of this invention. This embodiment has an unrestricted fill factor-it is essentially 100% as indicated by the box 302. This design can tolerate a high gate count design with smaller pixel pitch using the design rule "A" of FIG. 12B.

Figure 14:
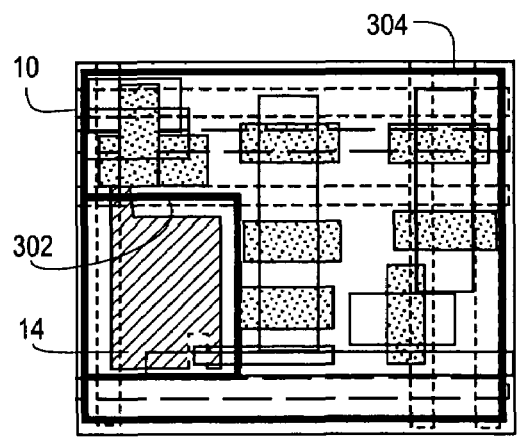
FIG. 14 shows a CMOS pixel layout with a relatively small pixel area and fill factor, which is a situation that is preferably avoided for most aerial reconnaissance applications for CMOS imagers.

FIG. 14 is a top view of a frontside illuminated pixel 10 with a high gate count using the design rule of FIG. 13 and a smaller pixel pitch. The smaller box 302 indicates the available area for scene illumination to impinge upon the photodiode detector 14. The fill factor (ratio of area bounded by box 302 to total area of pixel 10) is too small for most reconnaissance applications. Conversely, if back side illumination is incorporated into the design (as shown in FIG. 13), the fill factor is about 100%, as indicated by the larger box 304.

Presently preferred and alternative embodiments to this invention have been described. However, variation from the specifics of the disclosed embodiments is contemplated without departure from the scope of the invention. For example, while CMOS pixels have been described with one and two individual photodetectors, it is contemplated that additional photodetector (3, 4, or more in all) could be used. Additionally, it would be possible to utilize three or more different amplifier circuits and three or more separate output circuits, one per photodector. Each photodetector and associated amplifier circuit could be optimized for a different signal level, spectral band, or other criteria. Furthermore, in a three-detector embodiment, each detector could be associated with a separate red, blue or green color filter and thereby provide separate red, blue and green output signals for incident radiation. The array could be backside illuminated with windows adjacent to the array which have color filters applied to the windows. Alternatively, the array could be front side illuminated with separate imaging areas for each of the three colors.

Figure 15A:
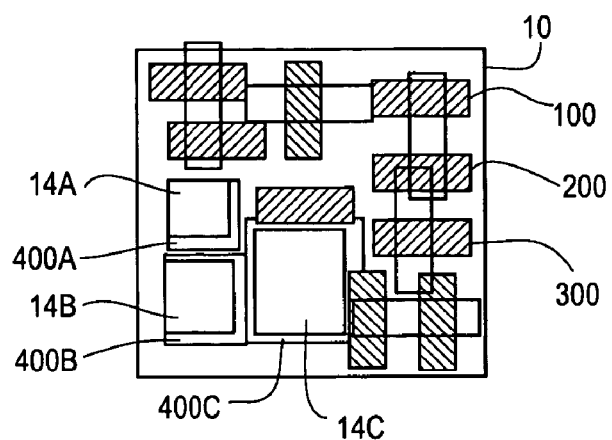
FIGS. 15A-C show several views of a color CMOS pixel sensor arrangement in accordance with yet another embodiment of the invention.
Figure 15B:
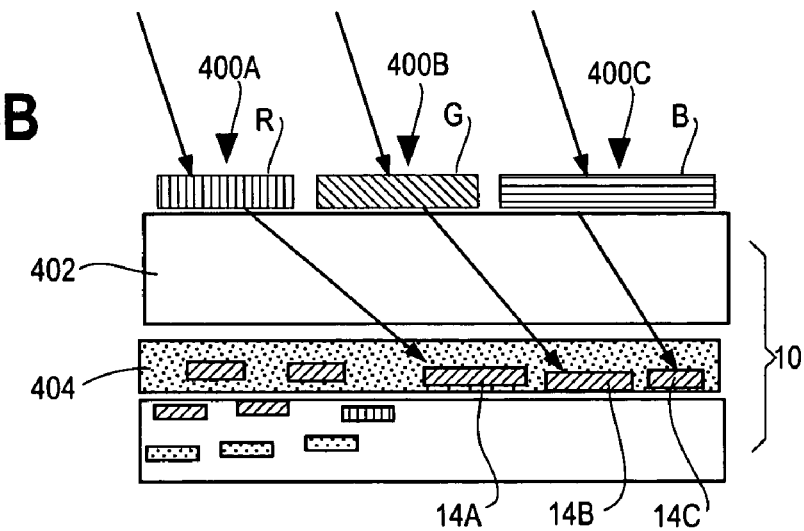
Figure 15C:
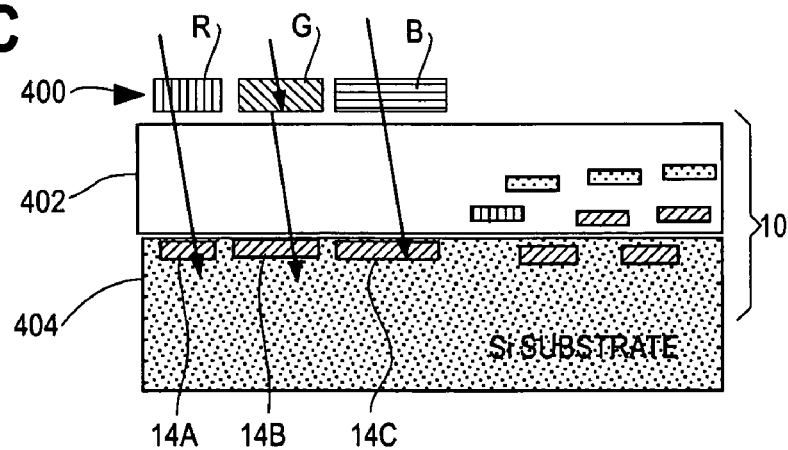

FIGS. 15A-C depict an alternative embodiment which could be employed using the invention to extract spectral information within a scene. Using multiple photodetectors, multiple pixel amplifiers, and a filter matrix such as filters 400A (e.g., red), 400B (e.g., green), 400C (e.g., blue), multiple wavelength bands or colors could be separately passed, such as red, green, and blue light (or near infra-red or other band) to the respective photodetectors 14A, 14B, 14C. Each pixel could simultaneously output multi-spectral scene data (such as red, blue and green scene data) that could be optimized for best signal to noise ratio. Because the photoresponse or quantum efficiency of the silicon photodetector is dependent on the wavelength of light (blue being weakest and red being strongest), the three detector/amplifier circuit combinations 100, 200, 300 within the pixel could be used to amplify the blue and green response to match that of the red response—thus normalizing the image sensor at the pixel level. Generally, this color normalizing function has to be done using downstream signal processing. Each detector/amplifier circuit combination output is transferred by its own output select circuit to a separate multiplexer, as is the case with the other embodiments. As shown in FIGS. 15B and 15C, the color filters 400 are mounted on top of a color filter substrate material 402 that is in close, but not touching, proximity to the silicon CMOS substrate 404. FIGS. 15A and 15C show a front-side illuminated configuration. FIG. 15B shows a backside illuminated configuration. Thus, both configurations are possible.

I claim:

1. An improved CMOS imaging array comprising a plurality of individual pixels arranged in rows and columns, each pixel comprising:
    a) a photodetector receiving incident light and generating a signal output;
    b) a first relatively lower gain, wide dynamic range amplifier circuit responsive to the output of the photodetector, the first circuit having a first sense node and a first amplifier, the first circuit optimized for a linear response to high light level input signals;
    c) a second, independent, relatively higher gain, lower dynamic range amplifier circuit responsive to the output of the photodetector, the second circuit having a second sense node and a second amplifier, the second circuit optimized to provide a high signal to noise ratio for low light level input signals;
    d) a first output select circuit for directing the output of the first amplifier circuit to a first output multiplexer;
    e) a second, independent, output select circuit for directing the output of the second independent amplifier circuit to a second output multiplexer;
    wherein separate outputs of the first and second circuits are provided for each of the individual pixels of the CMOS imaging array such that a signal from each of the first and second amplifier circuits can be independently and simultaneously read out from the pixel.

2. The imaging array of claim 1, wherein the first and second amplifier circuits comprise a charge to voltage conversion circuit responsive to the photodetector signal output.

3. The imaging array of claim 1, wherein the CMOS imaging array generates a frame of imagery, and wherein for the frame, each pixel produces two independent output voltages from the first and second circuits simultaneously.

4. The imaging array of claim 1, wherein each pixel comprises one photodiode detector and wherein the output of the photodiode detector is supplied to both the first and second amplifier circuits.

5. The imaging array of claim 1, wherein the first amplifier circuit and the second amplifer circuit comprise a source follower amplifier circuit having an input gate and wherein the first and second circuits further comprise a sense node capacitance Cnode 1 and Cnode 2, respectively, and wherein each sense node capacitance is comprised of the sum of cumulative parasitic capacitances and fixed capacitances, if any, present at the input gate of the source follower amplifier circuit of each first and second amplifier circuit, each sense node capacitance accumulating charge from the photodetector.

6. The imaging array of claim 5, wherein Cnode 1 of the first amplifier circuit and Cnode 2 of the second amplifier circuit have different capacitance values, and wherein the capacitance value of Cnode 1 is optimized for a relatively large charge accumulation such that it can accommodate the signal charge associated with the largest output signal from the photodetector, and wherein the capacitance of Cnode 2 is substantially smaller than the capacitance of Cnode 1 to thereby provide larger charge to voltage gain by the source follower amplifier circuit.

7. The imaging array of claim 6, wherein the capacitance Cnode 1 further comprises a fixed capacitor providing for additional charge accumulation from the photodetector.

8. The imaging array of claim 1, wherein the CMOS array is frontside illuminated.

9. The imaging array of claim 8, wherein the photodetector, first and second circuits, and pixel pitch are designed such that the pixel sensor achieves a fill factor of at least 30 percent.

10. The imaging array of claim 1, wherein the CMOS array is backside illuminated.

11. An improved CMOS imaging array comprising a plurality of individual pixels arranged in rows and columns, each pixel comprising:
    a) a first photodetector receiving incident light and generating a signal output;
    b) a first relatively lower gain, wide dynamic range amplifier circuit responsive to the output of the first photodetector, the first circuit having a first sense node and a first amplifier, the first circuit optimized for a linear response to high light level input signals;
    c) a second photodetector for receiving incident light and generating a signal output;
    d) a second, independent, relatively higher gain, lower dynamic range amplifier circuit responsive to the output of the second photodetector, the second circuit having a second sense node and a second amplifier, the second circuit optimized to provide a high signal to noise ratio for low light level input signals;
    e) a first output select circuit for selectively directing the output of the first independent amplifier circuit to a first output multiplexer provided for the imaging array;
    f) a second, independent, output select circuit for selectively directing the output of the second independent amplifier circuit to a second output multiplexer provided for the imaging array;
    wherein separate outputs of the first and second circuits are provided for each of the individual pixels of the imaging array such that a signal from each of the first and second amplifier circuits can be independently and simultaneously read out from the pixel.

12. The imaging array of claim 11, wherein the first amplifier circuit and the second amplifier circuit each comprise a charge to voltage conversion circuit responsive to the outputs of the first and second photodetectors, respectively.

13. The imaging array of claim 11, wherein the CMOS imaging array generates a frame of imagery, and wherein for each frame, each pixel produces output voltages from both the first and second circuits.

14. The imaging array of claim 11, wherein each pixel further comprises a mix gate wherein the output of the two photodetectors is combined to act as a single photodetector with a combined detection area of the two individual photodetectors and wherein the out put of the combined photodetector is supplied to both the first and second amplifier circuits.

15. The imaging array of claim 11, wherein the first amplifier circuit and the second amplifier circuit comprise a source follower amplifier circuit having an input gate and wherein the first and second circuits further comprise a sense node capacitance Cnode 1 and Cnode 2, respectively, and wherein each sense node capacitance is comprised of the sum of cumulative parasitic capacitances and fixed capacitances, if any, present at the input gate of the source follower amplifier circuit of each first and second amplifier circuit, Cnode 1 accumulating charge from the first photodetector and Cnode 2 accumulating charge from the second photodetector.

16. The imaging array of claim 15, wherein Cnode 1 of the first amplifier circuit and Cnode 2 of the second amplifier circuit have different capacitance values, and wherein the capacitance value of Cnode 1 is optimized for a relatively large charge accumulation such that it can accommodate the signal charge associated with the largest output signal from the photodetector, and wherein the capacitance of Cnode 2 is substantially smaller than the capacitance of Cnode 1 to thereby provide larger charge to voltage gain by the source follower amplifier circuit.

17. The imaging array of claim 15, wherein the capacitance Cnode 1 further comprises a fixed capacitor providing for additional charge accumulation from the photodetector.

18. The imaging array of claim 15, wherein the first circuit further comprises a transfer gate isolating Cnode 1 from the first photodetector and wherein the second circuit further comprises a transfer gate isolating Cnode 2 from the second photodetector.

19. The imaging array of claim 15, wherein Cnode 1 is not isolated from the first photodetector and wherein Cnode 1 includes the photodetector capacitance, and wherein Cnode 2 is isolated from the second photodetector by a transfer gate.

20. The imaging array of claim 11, wherein the CMOS array is backside illuminated.

21. The imaging array of claim 11, wherein the CMOS array is frontside illuminated.

22. The imaging array of claim 11, further comprising at least one color filter.

* * * * *